United States Patent [19]
Kerrick

[11] Patent Number: 5,763,060
[45] Date of Patent: Jun. 9, 1998

[54] PRINTED WIRING BOARD

[75] Inventor: Jon P. Kerrick, Minnetonka, Minn.

[73] Assignee: Advance Circuits, Inc., Minnetonka, Minn.

[21] Appl. No.: 678,655

[22] Filed: Jul. 11, 1996

[51] Int. Cl.$^6$ .............................. B32B 3/00; B32B 3/10; H05K 1/14; H01R 9/09
[52] U.S. Cl. .............................. 428/209; 428/131; 428/901; 361/739; 174/261; 174/255
[58] Field of Search .............................. 428/209, 615, 428/635, 131, 901; 361/739; 174/261, 255

[56] References Cited

U.S. PATENT DOCUMENTS

| | | | |
|---|---|---|---|
| 3,436,819 | 4/1969 | Lunie | 174/261 |
| 4,816,323 | 3/1989 | Inoue | 428/200 |
| 4,933,228 | 6/1990 | Katagiri et al. | 428/209 |
| 5,208,068 | 5/1993 | Davis et al. | 427/97 |
| 5,286,926 | 2/1994 | Kimura et al. | 174/250 |
| 5,288,541 | 2/1994 | Blackwell et al. | 428/209 |

OTHER PUBLICATIONS

Shipment Invoice No. SAL233 for prototype of the present invention, according to paper No. 5 filed on Jan. 14, 1997.
Gore, Electronic Products Division, "The Mixed Dielectric Approach: Improving Speed and Density with Gore-Ply Precision Dielectric Prepreg", Jul. 1990, 6 pages.
Gore, Electronic Products Division, "Gore, Electronic Products Division, Effect of Low Dieelectric Material on Printed Circuit Boards", Apr. 1990, 7 pages.
W.L. Gore, & Associate, Inc., SPEEDBOARD™ N High Performance FR-4 Prepreg, Engineer's Summary, Feb. 1994, 2 pages.
W.L. Gore, & Associate, Inc., Advanced Dielectric Products, SPEEDBOARD™ Prepregs High Performance Prepregs, Engineer's Summary, copyright 1993, 1 page.
W.L. Gore, & Associate, Inc., SPEEDBOARD™ N High Performance FR-4 Prepreg, drawing.

Primary Examiner—Paul J. Thibodeau
Assistant Examiner—Cathy F. Lam
Attorney, Agent, or Firm—Christie, Parker & Hale, LLP

[57] ABSTRACT

Described is a printed wiring board comprising a composite of an electrically conductive core laminated with layers of dielectric material and electrically conductive material.

12 Claims, 1 Drawing Sheet

PRINTED WIRING BOARD

FIELD OF THE INVENTION

The invention relates to a printed wiring board, and more particularly a double-sided printed wiring board comprising a composite of two layers of dielectric material laminated to an electrically conductive core.

BACKGROUND OF THE INVENTION

A printed wiring board is the interconnection medium upon which circuit components are formed into electronic systems. The two primary functions of printed wiring boards are to provide support for circuit components and to interconnect these components electrically. As the performance, efficiency, and reliability requirements for electronic systems increase, there is a corresponding need for improvements in all aspects of printed wiring board technology.

In an increasing number of applications, the commonly available printed wiring board is proving to be thermally inadequate. The glass-based laminates generally used in printed wiring boards have relatively low thermal conductivities and result in poor heat management within the printed wiring board. Another problem of such boards is "cross-talk" which is a phenomenon that may occur as the speed of these electronic systems increase.

It is apparent that there is a need for a printed wiring board that exhibits both enhanced thermal heat dissipation and improved electromagnetic interference shielding to avoid or minimize "cross-talk".

SUMMARY OF THE INVENTION

In accordance with the present invention there is provided a printed wiring board comprising an electrically conductive core laminated on both side with dielectric material. The core has a plurality of apertures therein, also referred to as relief apertures, a first layer of electrically conductive material on each of the dielectric layers and a second layer of electrically conductive material over the first layer. Dielectric material substantially fills the relief apertures and a hole extends through at least one relief aperture from the electrically conductive layers through the core. The side walls of which is metalized, e.g. plated or otherwise provided, with an electrically conductive material, to electrically connect the opposing sides of the printed wiring board.

In the preferred embodiment a dielectric material comprising expanded Teflon (or polyetrafluoroethylene) coated with epoxy is bonded to opposite sides of a copper core, a copper foil is on the teflon layers, and copper is plated onto the copper foil, and after appropriate masking and etching, a desired conductive pattern of the printed wiring board is developed. A layer of gold or palladium may be applied onto the outer copper layer to facilitate wire bonding.

DETAILED DESCRIPTION

Figure 1:
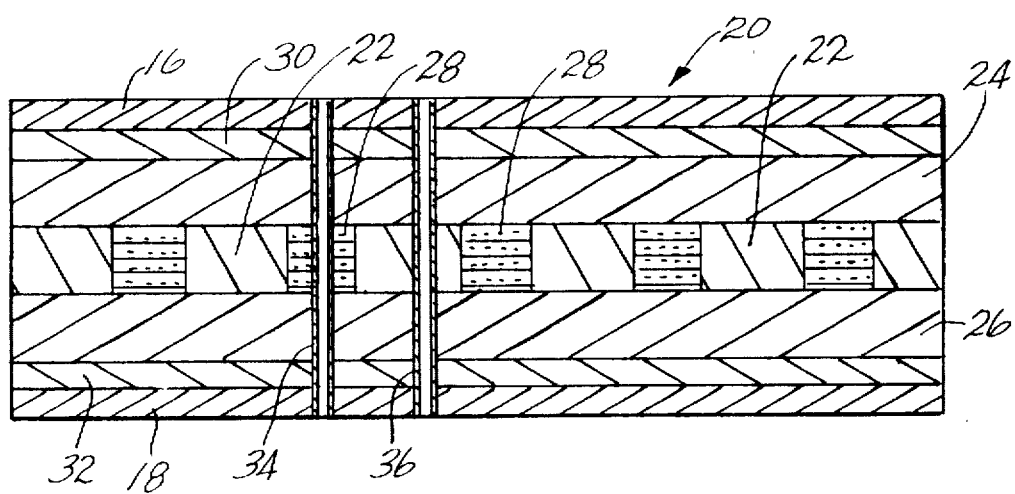
FIG. 1 is a schematic diagram of the cross section of a printed wiring board.

A printed wiring board according to the present invention is illustrated in FIG. 1. The double-sided printed wiring board 20 comprises an electrically conductive core 22, preferably copper. Relief apertures 28 are etched into the conductive core 22 which is laminated with upper and lower layers of dielectric material, 24 and 26, and a first layer of conductive material, preferably copper foil, 30 and 32, so that the core 22 is located between the two dielectric layers 24 and 26. The dielectric material substantially fills the relief apertures 28 as the dielectric layers are laminated to the conductive core 22 to form a composite. A hole, 34, is drilled through at least one relief aperture, and is provided with a metal lining at the side walls, such as by being plated during the plating of the second layer of conductible material, 16 and 18, e.g. plated side walls. At least one other hole, 36, is drilled through the composite in areas without relief apertures to form an electrical ground connection. These holes, 34 and 36, extend from the upper conductive layers, 16 and 18, through layers 30 and 32 and 24 and 26 and conductive core 22. A second conductive layer, 16 and 18, preferably copper applied by plating, is on the copper foil, 30 and 32. The hole(s) 34 having plated side walls extend through the etched relief apertures filed with dielectric material between the second conductive layers, 16 and 18, in such a way so that there is no shorting with the conductive core 22, i.e., that is, they are insulated from the core. A further layer of gold or electroless plated palladium may be applied to the second conductive layers to facilitate wire bonding.

Two thin layers of electrically conductive material, 30 and 32, which are preferably copper metal foil, are clad to the dielectric layers 24 and 26 to form the first upper and lower electrically conductive layers and second, or outer, electrically conductive material is applied over the first conductive layers. The conductive layers 16 and 18 can be etched to the desired electrically conductive pattern for the printed wiring board 20. For example, a soldering mask may be applied to the areas of the conductive layers 16 and 18 to be protected from being coated by solder during the soldering process. The desired conductive pattern may be fabricated on both sides of the printed wiring using one of several processes well known in the art (e.g. etching, plating, stamping).

In the preferred embodiment, the conductive core 22 is copper, preferably about 10 mil, which is desireable because it enhances the heat distribution characteristics of the composite printed wiring board. Also, a copper core serves as an electromagnetic interference shield, which reduces the amount of signal cross talk. The relatively thin copper core allows the relief apertures 28 to be conveniently made by chemical milling. Chemical milling is less costly and more precise than mechanical drilling, thus allowing for more efficient and reliable manufacturing of the printed wiring boards according to this invention.

Advantageously, the material selected for the dielectric layer has certain properties, such as a dielectric constant of about 3, a glass transition temperature of at least 125° C., and thickness in the range of about 1 to 5 mils. In the preferred embodiment, the dielectric layers 24 and 26 comprise expanded TEFLON (or polyterafluoroethylene) coated with an epoxy resin. One example of a commercially available material with these properties is "SPEEDBOARD N", available from W. L. Gore & Associates, Inc. located in Elkton, Md.

The expanded TEFLON (or polytetrafluoroethylene) is superior to glass-based dielectric material commonly used in the printed wiring board industry. In contrast to the glass-based dielectric material, the expanded teflon has zero particulate discharge from its edge surfaces while in use. This is an especially important requirement for certain applications (e.g. in a disk drive environment). The combination of the expanded TEFLON (or polytetrafluoroethylene) and epoxy resin in the relief apertures also effectively insulates the metal at the side walls of holes 34, from being shorted to the conductive core 22.

The following is an example of the printed wiring board which may be produced in accordance with the invention.

An electrically conductive core 0.010 mil. copper is provided and etched to create relief apertures. Two layers of "SPEEDBOARD N" and copper foil ("first electrically conductive layers") are laminated to the copper core to form a laminated composite. As the "Speedboard N" is being applied to the copper core, it substantially fills the relief apertures within the core. Separate holes are drilled into the composite; one set of holes are drilled through at least one of the relief apertures filled with dielectric material and at least one hole is drilled elsewhere through the dielectric layers and core. The latter hole(s) is designed to accommodate an electrical ground connection and the former holes are used to enable electrical connection between the electrically conductive material on opposite sides of the core. The diameter of the drilled holes may range from about 0.01 to 0.1 inches.

The first conductive layers on the dielectric layers are "panel plated" with electrically conductive material to a desired electrically conductive pattern and electrically conductive material is applied to the side walls of predrilled holes in the relief apertures. The term "panel plated" refers to providing metal side walls for the holes drilled through the core at the relief apertures. For example, the layers of "SPEEDBOARD N" 24 and copper foil are plated or clad with extremely thin layer of copper generally in the range of about 0.0005 to 0.001 inches. After cleaning, a negative conductive pattern image is then applied to the copper layers (16 and 18 in FIG. 1) and an etch-resistant layer is applied to the exposed copper. An etchant is applied to the copper layers and all of the copper not protected by the etch-resistant material is removed. For example, after cleaning the etched surfaces, a liquid photo imaginable solder mask is applied to the printed wiring board in those areas, such as the patterned conductor surfaces, that are to be protected from being coated by solder in the soldering process. Once the solder mask has been applied, it is thermally cured, e.g. at 305 F. for 90 minutes.

Additionally, a wire bondable gold or palladium surface may be applied to the conductive layers 16 and 18 to facilitate wire bonding. This may be done, for example, by first applying an extremely thin layer of electroplated nickel, followed by an even thinner layer of electroplated soft-gold. The nickel layers may be about 0.000125 to 0.00025 inches thickness and the gold approximately 0.000025 to 0.000050 inches thickness. Alternatively, an electroless palladium process may be used which is less expensive than the electroplated nickel/soft gold process.

Once the gold (or palladium) has been applied, it is desireable to heat the composite, e.g. by baking at about 300 F. for about 1 hour, to ensure that the gold and solder mask sufficiently adhere to the board.

It is apparent from the foregoing that various changes and modifications may be made without departing from the invention.

What is claimed is:

1. A printed wiring board comprising:
    a central core of electrically conductive material having an upper and lower surface, and a plurality of apertures therethrough;
    a layer of dielectric material on each of the upper and lower surface of the core, and dielectric material substantially filling the apertures through the core;
    electrically conductive material within some of the apertures;
    a first layer of electrically conductive material on each of the dielectric layers;
    a second layer of electrically conductive material on said first layer of electrically conductive material; and
    an electrically conductive path between the layers of electrically conductive material on each of the dielectric layers through at least one of the apertures having electrically conductive material therein, said electrically conductive path being electrically insulated from the core.

2. A printed wiring board according to claim 1 further comprising an electrical ground path between the layers of electrically conductive material and through the dielectric layers and the electrically conductive core.

3. A printed wiring board according to claim 1 wherein said dielectric material comprises expanded polytetrafluoroethylene coated with epoxy resin.

4. A printed wiring board according to claim 1 wherein said core comprises copper.

5. A printed wiring board according to claim 1 wherein said first layer of electrically conductive material comprises copper.

6. A printed wiring board according to claim 5 wherein said first layer of electrically conductive material comprises copper.

7. A printed wiring board according to claim 1 further comprising gold or palladium disposed on the second electrically conductive layers.

8. A printed wiring board according to claim 1 wherein said first electrically conductive layers comprise copper foil and said second layer on top of the copper foil of electrically conductive material comprises another layer of copper.

9. A printed wiring board comprising:
    a central core of copper having an upper and lower surface, and a plurality of apertures therethrough;
    a layer of dielectric material comprising expanded polytetrafluorethylene coated with epoxy resin on each of the upper and lower surfaces of the core, and dielectric material substantially filling the apertures through the copper core;
    electrically conductive material within some of the apertures extending through in the core;
    a first layer comprising copper foil on each of said layers of dielectric material;
    a second layer of copper on each of said first copper foil layers; and
    an electrically conductive path between the second layers of copper extending through at least one of the apertures having electrically conductive material therein, said electrically conductive path being electrically insulated from the copper core by the dielectric material in the apertures.

10. A printed wiring board according to claim 9 further comprising an electric ground connection between the upper and the lower second electrically conductive layers through the core.

11. A printed wiring board according to claim 9 wherein said electrically conductive material in some apertures enabling said electrical path comprises a metallic material on the side walls of an aperture which extends between the first and second conductive layers.

12. A printed wiring board according to claim 9 further comprising gold or palladium disposed on the second copper layer.

* * * * *

UNITED STATES PATENT AND TRADEMARK OFFICE
CERTIFICATE OF CORRECTION

PATENT NO.   : 5,763,060
DATED        : June 9, 1998
INVENTOR(S)  : Jon P. Kerrick It is certified that error appears in the above-indentified patent and that said Letters Patent is hereby corrected as shown below:

Column 1, line 36, change "side" to -- sides --.
Column 1, line 48, change "polyetrafluoroethylene" to
    -- polytetrafluoroethylene --.
Column 2, line 16, change "filed" to -- filled --.
Column 2, line 37, change "desireable" to -- desirable --.
Column 2, line 52, change "polyetrafluoroethylene" to
    -- polytetrafluoroethylene --.
Column 3, line 18, change "inches" to -- inch --.
Column 3, line 27, after "with" insert -- an --.
Column 3, line 28, change "inches" to -- inch --.
Column 3, line 39, change "305 F." to -- 305° F. --.
Column 3, lines 45, 47 change "inches" to -- inch -- (both occurrences).
Column 3, line 51, change "desireable" to -- desirable --.
Column 3, line 51, change "about 300" to -- about 300° --.
Column 3, line 64, change "surface" to -- surfaces --.
Column 4, line 42, after "through" delete "in".

Signed and Sealed this

Second Day of March, 1999

Attest:

Q. TODD DICKINSON

*Attesting Officer*  *Acting Commissioner of Patents and Trademarks*